(12) United States Patent
Tavakkoli Kermani Ghariehali

(10) Patent No.: US 10,976,657 B2
(45) Date of Patent: Apr. 13, 2021

(54) SYSTEM AND METHOD FOR ILLUMINATING EDGES OF AN IMPRINT FIELD WITH A GRADIENT DOSAGE

(71) Applicant: CANON KABUSHIKI KAISHA, Tokyo (JP)

(72) Inventor: Amir Tavakkoli Kermani Ghariehali, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 271 days.

(21) Appl. No.: 16/118,794

(22) Filed: Aug. 31, 2018

(65) Prior Publication Data
US 2020/0073232 A1     Mar. 5, 2020

(51) Int. Cl.
| | | |
|---|---|---|
| G03F 7/00 | (2006.01) |
| H01L 21/687 | (2006.01) |
| H01L 21/68 | (2006.01) |
| H01L 21/3105 | (2006.01) |
| H01L 21/67 | (2006.01) |
| G03F 7/20 | (2006.01) |
| B29C 59/02 | (2006.01) |

(52) U.S. Cl.
CPC ...... *G03F 7/0002* (2013.01); *B29C 2059/023* (2013.01); *G03F 7/2022* (2013.01); *G03F 2007/2067* (2013.01); *H01L 21/31058* (2013.01); *H01L 21/6715* (2013.01); *H01L 21/67092* (2013.01); *H01L 21/67115* (2013.01); *H01L 21/68* (2013.01); *H01L 21/68714* (2013.01)

(58) Field of Classification Search
CPC ... G03F 7/0002; G03F 7/2022; B29C 59/022; B29C 2059/023
See application file for complete search history.

(56) References Cited

U.S. PATENT DOCUMENTS

| | | | | |
|---|---|---|---|---|
| 5,168,304 A | * | 12/1992 | Hattori | G03F 7/2022 355/50 |
| 5,340,700 A | * | 8/1994 | Chen | G03F 7/2022 430/311 |
| 5,811,211 A | * | 9/1998 | Tanaka | G03F 7/70066 382/145 |
| 6,936,194 B2 | | 8/2005 | Watts | |

(Continued)

FOREIGN PATENT DOCUMENTS

| | | | |
|---|---|---|---|
| JP | 2014188869 A | * | 10/2014 |
| JP | 2016-058735 A | | 4/2016 |

(Continued)

OTHER PUBLICATIONS

Niyaz Khusnatdinov, Edward Brian Fletcher, Craig William Cone, Douglas J. Resnick, Zhengmao Ye, U.S. Appl. No. 15/837,898, filed Dec. 11, 2017.

*Primary Examiner* — Benjamin A Schiffman
(74) *Attorney, Agent, or Firm* — Daniel Ratoff

(57) ABSTRACT

Systems and methods for imprinting formable material on a substrate with a template. Illuminate the formable material with a gelling radiation distribution pattern. The gelling radiation distribution pattern has a gelling dosage that that varies from a minimum gelling dosage at each of a plurality of corners of a boundary edge to a peak gelling dosage at a center of each of the boundary edges.

6 Claims, 7 Drawing Sheets

(56) References Cited

U.S. PATENT DOCUMENTS

| | | | |
|---|---|---|---|
| 6,960,532 B2* | 11/2005 | Chen | G03F 7/2022 |
| | | | 257/E21.026 |
| 7,157,036 B2 | 1/2007 | Choi et al. | |
| 7,815,425 B2* | 10/2010 | Tokita | B29C 43/14 |
| | | | 425/174.4 |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,361,371 B2* | 1/2013 | Khusnatdinov | B82Y 40/00 |
| | | | 264/319 |
| 8,480,946 B2* | 7/2013 | Mikami | B82Y 10/00 |
| | | | 264/496 |
| 8,609,326 B2 | 12/2013 | Sreenivasan et al. | |
| 8,641,958 B2 | 2/2014 | Khusnatdinov et al. | |
| 8,946,093 B2* | 2/2015 | Mikami | B82Y 10/00 |
| | | | 438/780 |
| 10,101,663 B2* | 10/2018 | Wakabayashi | G03F 7/70 |
| 10,663,869 B2* | 5/2020 | Khusnatdinov | G03F 7/70116 |
| 2005/0212156 A1 | 9/2005 | Tokita et al. | |
| 2008/0303187 A1 | 12/2008 | Stacey et al. | |
| 2009/0200710 A1 | 8/2009 | Khusnatdinov et al. | |
| 2009/0224436 A1 | 9/2009 | Mikami et al. | |
| 2011/0273684 A1 | 11/2011 | Owa et al. | |
| 2014/0027955 A1 | 1/2014 | Wakabayashi et al. | |
| 2018/0162014 A1 | 6/2018 | Fletcher | |
| 2020/0333704 A1* | 10/2020 | Koide | H01L 21/0271 |

FOREIGN PATENT DOCUMENTS

| | | | |
|---|---|---|---|
| JP | 2019-075551 A | | 5/2019 |
| KR | 2006013245 A | * | 2/2006 |
| WO | 2019/078060 A1 | | 4/2019 |

* cited by examiner

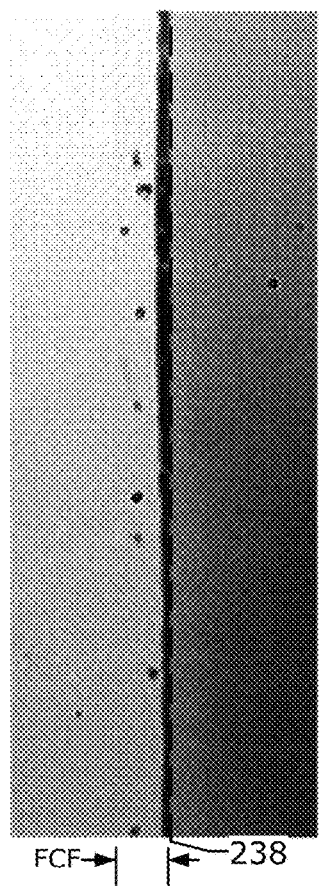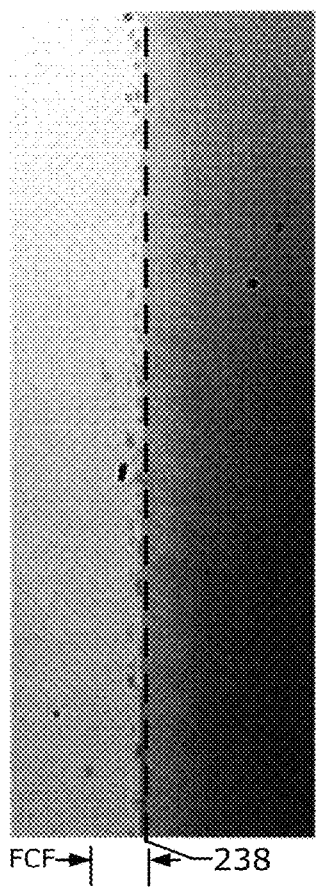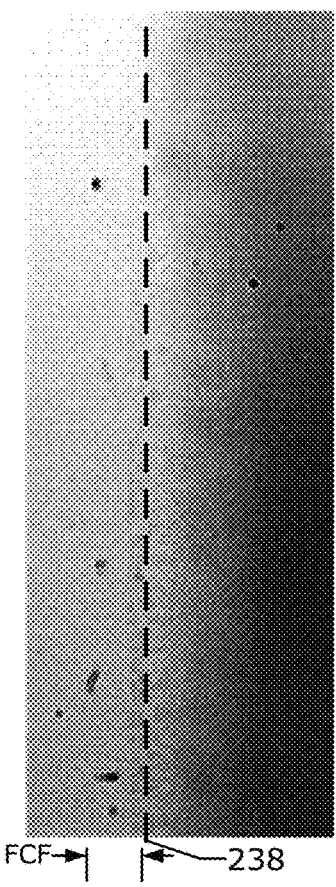
FIG. 3A  FIG. 3B  FIG. 3C
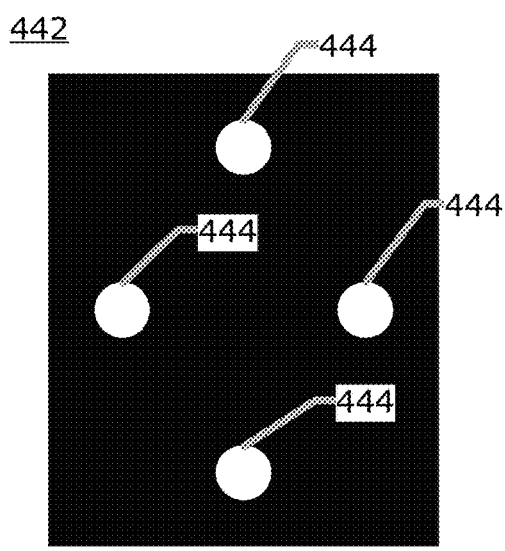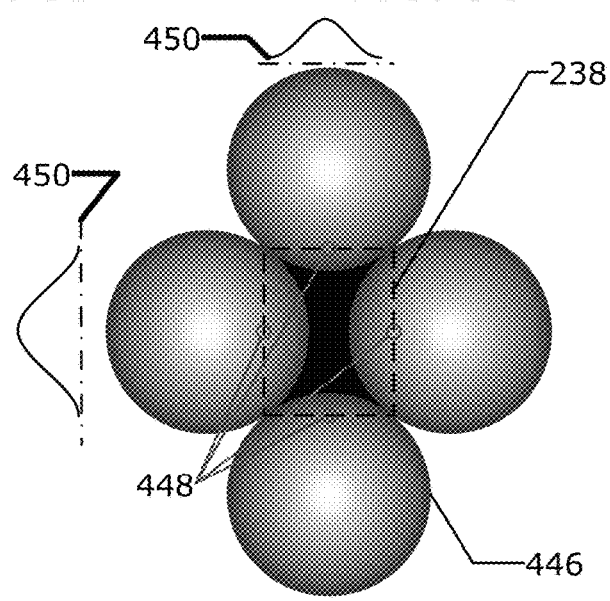
FIG. 4A  FIG. 4B

SYSTEM AND METHOD FOR ILLUMINATING EDGES OF AN IMPRINT FIELD WITH A GRADIENT DOSAGE

BACKGROUND

Field of Art

The present disclosure relates to systems and methods for illuminating the edges of an imprinting field.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

The imprinting process can produce extrusions as formable material leaks out of from under the template.

SUMMARY

At least a first embodiment, may be an imprinting system configured to imprint a formable material with a template. The imprinting system may comprise a template chuck configured to hold the template. The imprinting system may further comprise a substrate chuck configured to hold a substrate. The imprinting system may further comprise a positioning system configured to bring a template into contact with the formable material on the substrate. The template may have a pattern region that includes patterning features. The pattern region may include a boundary edge that surrounds the pattern region. The boundary edge may include a plurality of corners and a plurality of edges connecting each of the plurality of corners. The imprinting system may further comprise an illumination system configured to illuminate the formable material with a gelling radiation distribution pattern. The illumination system may include a plurality of apertures. Each aperture among the plurality of apertures may be positioned equidistant from two corners among the plurality of corners of the template which is used to produce gelling radiation distribution pattern. The gelling radiation distribution pattern may have a gelling dosage that has a dosage that varies from a minimum gelling dosage at each of the plurality of corners of the boundary edge to a peak gelling dosage at a center of each of the boundary edges.

In an aspect of the first embodiment, the gradient dosage may gradually vary from the minimum gelling dosage at each of the plurality of corners of the boundary edge to the peak gelling dosage at the center of each of the boundary edges.

In an aspect of the first embodiment, the gradient dosage may vary in a step wise manner from the minimum gelling dosage at each of the plurality of corners of the boundary edge to the peak gelling dosage at the center of each of the boundary edges.

In an aspect of the first embodiment, the imprinting system may further comprise a dispenser configured to dispense the formable material.

In an aspect of the first embodiment, the illumination system may be further configured to illuminate the pattern region with a curing radiation distribution pattern.

In an aspect of the first embodiment, the illumination system may comprise an actinic energy source that produces the curing radiation distribution pattern; and a spatial filter that may be configured to be placed in: a first position in an optical path between the actinic energy source and the template; and a second position not in the optical path between the actinic energy source and the template. When the spatial filter is in the first position, the actinic energy source is configured to produce the gelling radiation distribution pattern at the boundary edge of the template. When the spatial filter is in the second position, the actinic energy source is configured to produce the curing radiation distribution pattern in the pattern region.

In an aspect of the first embodiment, the spatial filter may include the plurality of apertures In an aspect of the first embodiment, each aperture among the plurality of apertures may be offset from the boundary edge of the template when the spatial filter is in the first position.

In an aspect of the first embodiment, the template may include light blocking material that absorbs or reflects the gelling radiation distribution pattern outside of a region bounded by the plurality of boundary edges.

In an aspect of the first embodiment, each of the plurality of apertures may be oval, rectangular, or circular.

In an aspect of the first embodiment, the illumination system may comprise: a first actinic energy source that produces the curing radiation distribution pattern; and a second actinic energy source that produces the gelling radiation distribution pattern.

In an aspect of the first embodiment, the illumination system may further comprise: an optical combiner that combines energy from both the first actinic energy source and the second actinic energy source onto a single optical path.

In an aspect of the first embodiment, the second actinic energy source comprises a plurality of energy sources. Each of the plurality of energy sources may be associated with one of apertures among the plurality of apertures. Each energy source among the plurality of energy sources produces a portion of the gradient dosage that gradually varies from the minimum gelling dosage at two corners among the plurality of corners to the peak gelling dosage at the center of one of the boundary edges.

In an aspect of the first embodiment, the second actinic energy source may comprise a plurality of energy sources. Each of the plurality of energy sources may be associated with one of apertures among the plurality of apertures. Each energy source among the plurality of energy sources produces a portion of the gradient dosage that varies in a step wise manner from the minimum gelling dosage at two corners among the plurality of corners to the peak gelling dosage at the center of one of the boundary edges.

At least a second embodiment, may be an imprinting method configured to imprint formable material on a substrate with a template that has a pattern region that includes patterning features. The pattern region may include a boundary edge that surrounds the pattern region. The boundary edge may include a plurality of corners and a plurality of edges connecting each of the plurality of corners. The method may comprise bringing the template into contact with the formable material on the substrate. The method may further comprise illuminating the formable material with a gelling radiation distribution pattern. The gelling radiation distribution pattern may have a gelling dosage that has a gradient dosage that varies from a minimum gelling dosage at each of the plurality of corners to a peak gelling dosage at a center of each of the boundary edges. The gelling radiation distribution pattern may come from a plurality of apertures. Each aperture among the plurality of apertures may be positioned equidistant from two corners among the plurality of corners of the template which is used to produce gelling radiation distribution pattern. The method may further comprise illuminating the pattern region with a curing radiation distribution pattern.

In an aspect of the second embodiment, the gradient dosage may gradually vary from the minimum gelling dosage at each of the plurality of corners of the boundary edge to the peak gelling dosage at the center of each of the boundary edges.

In an aspect of the second embodiment, the gradient dosage may vary in a step wise manner from the minimum gelling dosage at each of the plurality of corners of the boundary edge to the peak gelling dosage at the center of each of the boundary edges.

In an aspect of the second embodiment, the method may further comprise placing a spatial filter in a first position in an optical path between an actinic energy source and the template so as to produce the gelling radiation distribution pattern. The method may also further comprise placing the spatial filter in a second position not in the optical path between the actinic energy source and the template so as to illuminate the pattern region with the curing radiation distribution pattern.

In an aspect of the second embodiment, a first actinic energy source may be used to illuminate the pattern region with the curing radiation distribution pattern. A second actinic energy source may be used to illuminate the pattern region with the curing radiation distribution pattern.

At least a third embodiment, may be a method of manufacturing an article with an imprinting method. The imprinting method may be configured to imprint formable material on a substrate with a template that has a pattern region that includes patterning features. The pattern region includes a boundary edge that surrounds the pattern region. The boundary edge includes a plurality of corners and a plurality of edges connecting each of the plurality of corners. The method of manufacturing an article may comprise bringing the template into contact with the formable material on the substrate. The method of manufacturing an article may further comprise illuminating the formable material with a gelling radiation distribution pattern. The gelling radiation distribution pattern has a gelling dosage that has a gradient dosage that may vary from a minimum gelling dosage at each of the plurality of corners to a peak gelling dosage at a center of each of the boundary edges. The gelling radiation distribution pattern may come from a plurality of apertures. Each aperture among the plurality of apertures may be positioned equidistant from two corners among the plurality of corners of the template which is used to produce gelling radiation distribution pattern. The method of manufacturing an article may further comprise illuminating the pattern region with a curing radiation distribution pattern. The method of manufacturing an article may further comprise processing the substrate on which the pattern has been formed. The article may be manufactured from the processed substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

FIGS. 3A-C are micrographs of formable material as it spreads towards different portions of a boundary edge.

FIGS. 4A-4I are illustrations of spatial filters, radiation distributions, and systems as used in embodiments.

Figure 1:
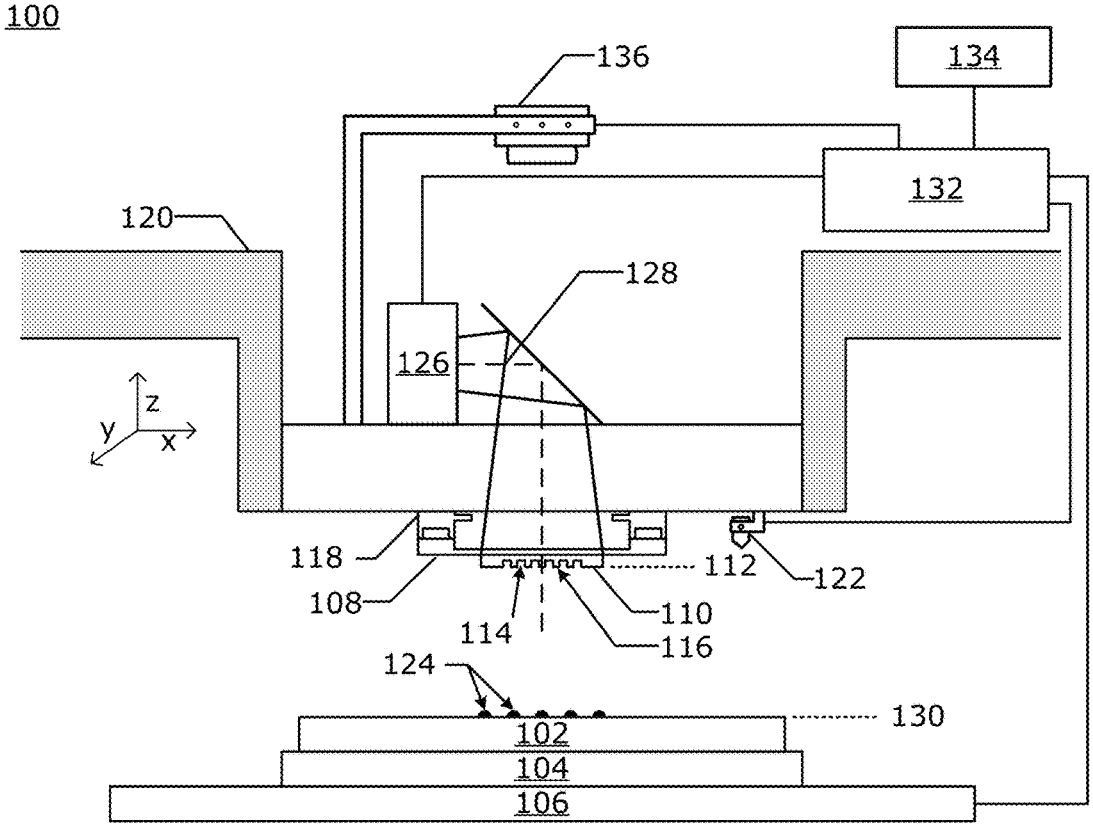
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a system and/or method that prevents extrusions from forming on the sidewalls or removing extrusions from sidewalls while protecting the pretreated patterning surface.

Nanoimprint System

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features in a pattern region defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate. A boundary edge surrounds the patterning region of the patterning surface 112. The boundary edge is defined by a plurality of corners (4 corners for a quadrilateral (i.e. rectangle) patterning region) and a plurality of edges. Each edge of the boundary edge connects 2 corners. In an embodiment, edges and corners of the mesa 110 define the boundary edge. In an embodiment, the boundary edge is inset from edges and corners of the mesa 110.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move the template 108 by moving the bridge relative to the substrate or moving the template relative to the bridge.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128. An optical path of the camera 128 and the exposure path may be combined with a beam combiner/splitter, a dichroic combiner, or tiled apertures.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Imprinting Method

The imprinting method may include dispensing formable material onto the substrate. The positioning system may then move the imprint head, the substrate positioning stage 106, or both to varying a distance between a patterning surface 112 of the mold 110 and the substrate 102 to define a desired volume that is filled by the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to cure, solidify, and/or cross-link conforming to a shape of the substrate surface 130 and the patterning surface 112, defining a patterned layer on the substrate 102. The formable material 124 is cured while the template 108 is in contact with formable material 124 forming the patterned layer on the substrate 102. Thus the nanoimprint lithography system 100 uses an imprinting process to form the patterned layer which has recesses and protrusions which are an inverse of the pattern in the patterning surface 112.

An imprinting method may be performed on a whole substrate basis or repeatedly in a plurality of imprint fields (i.e. shot regions) that are spread across the substrate surface 130. Each of the imprint fields may be the same size as the mesa 110 or just the pattern region of the mesa 110. The pattern region of the mesa 110 is a region of the patterning surface 112 which is used to imprint patterns on a substrate 102 which are features of the device or are then used in subsequent processes to form features of the device. The pattern region of the mesa 110 may or may not include fluid control features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) above a highest point on the substrate surface 130 in each imprint field. The patterned layer may also include one or more features such as protrusions which extend above the residual layer having a thickness. These protrusions match the recesses 114 in the mesa 110.

Extrusions

During the imprinting process, extrusion may be formed, for example, the formable material 124 may accumulate on the mesa sidewalls 452 via one or both seepage or vapor deposition. The applicant has found that it is advantageous to prevent the formation of extrusions on the sidewalls or on the area surrounding the imprint field on the substrate. Formable material spreads within the pattern region underneath the template and approaches the boundary edges and reaches the boundary corners last. If the formable material spreads beyond the edges of the boundary edge before it reaches the boundary corners then extrusions can form.

Edge Gelling

One method that is helpful in preventing extrusions is partially curing the formable material as it approaches the boundary edge which causes the formable material thicken (i.e. gel). The formable material can be partially cured by exposing the formable material to a gelling dosage of actinic radiation that is less than the curing dosage. In an embodiment, the actinic radiation is uncollimated UV light. The applicant has found that it is advantageous to have the formable material flow at a faster rate as it approaches the corners than as it approaches the center of the boundary edges. The applicant has found a method of accomplishing this by illuminating each of the boundary edges with a diffuse spot with an intensity peak near the center of each of the boundary edge which gradually decreases until it reaches the corners. In an alternative embodiment, the intensity varies in a step wise manner from a peak at the boundary edge centers 448. This may be accomplished by using a spatial filter which has step wise attenuation variations. During and after being illuminated with this type of gelling radiation distribution pattern, the middles of the edges have a slower flow rate than the corners. The applicant has found that this can diminish extrusions and reduce the number of non-fill defects in the corners.

Figure 2:
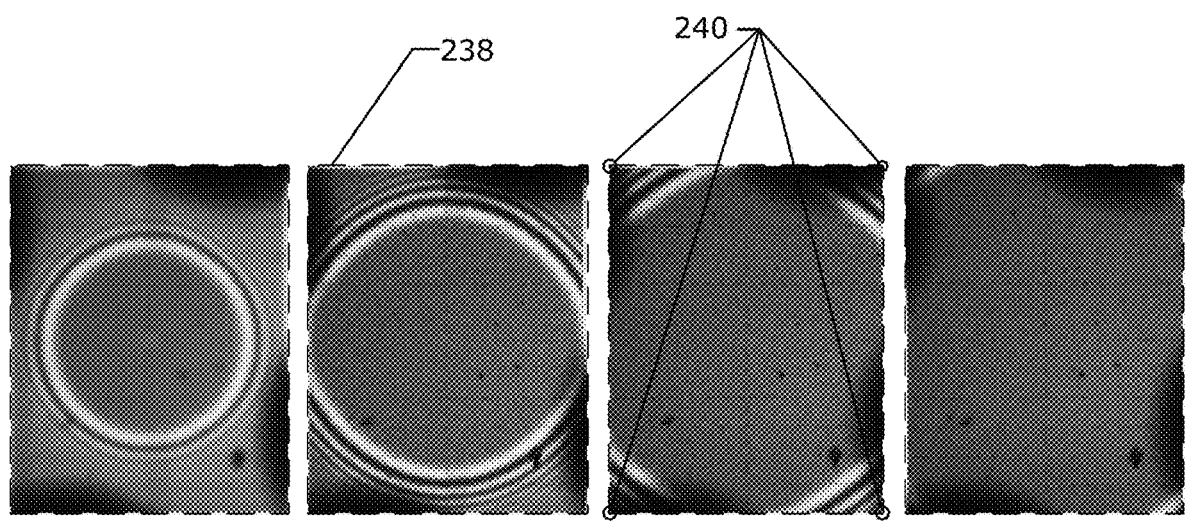
FIG. 2 is an illustration of snapshots from a spread camera illustrating the spread of formable material under a template.

During the imprinting process, formable fluid spreads from the pattern region of an imprint field to the boundary edges of the imprint field. There can be a time delay between filling of different locations on the boundary edges of an imprint field. This time delay can increase with distance from the middle of the edges to the corners as illustrated in FIG. 2. FIG. 2 shows snap shots obtained by camera 136 of formable material 124 spreading underneath the template 108 and approaching boundary edges 238 at various point in the filling of the pattern region. The boundary edges 238 are illustrated as dashed lines. The pattern region illustrated in FIG. 2 is rectangular with four boundary corners 240.

The formable material may be dispensed as a plurality of droplets in an imprint field on the substrate in a droplet pattern on the substrate. The droplet pattern on the substrate imprint field. In order to prevent extrusions, the droplet pattern may not extend all the way to boundary edge and may be limited to drop edge exclusion (DEE) that is inset from the boundary edge as described in US Patent Publication 2018/0162014 which is hereby incorporated by reference. There is a small window of time for the formable material 124 to fill the edges. If a droplet pattern with a DEE is established to fill the boundary corners 240, extrusions may occur along the boundary edges 238. However, if a droplet pattern with a DEE is established to prevent extrusions, the boundary corners may not be filled.

FIGS. 3A-C are micrographs of cured formable material along a boundary edge 238 of an imprint field. In the example illustrated in FIGS. 3A-C the template 108 includes a fluid control feature (FCF) at the boundary edge 238. A FCF is a feature that some templates include and are used to change the flow of formable material under the template. For example, the FCF can change the relative speed and direction at which formable material flows under the template by changing the gap between the substrate and the template. Changing the gap also changes the capillary pressure that the formable material feels. When the capillary pressure changes the differential acceleration that the formable material feels as it passes through the FCF also changes. In an embodiment, the pattern area includes the FCF. FIG. 3A is a micrograph of cured formable material at the boundary edge 238 near the center of the boundary edge 238. FIG. 3B is a micrograph of cured formable material at the boundary edge 238 away from the center of the boundary edge 238. FIG. 3C is a micrograph of cured formable material at the boundary edge 238 near a boundary corner 240. The dark line shown in FIG. 3A is a portion of the FCF near a middle portion of a boundary edge being partially filled by formable material. FIG. 3B illustrates that as you move away from the middle portion of the boundary edge there is less formable material in the FCF. FIG. 3C illustrates that as you approach the corners the formable material does not reach the boundary edge and the pattern area near the corners remains unfilled.

The applicant has determined that better imprints are obtained if the spread of formable material 124 near the center of the boundary edge is slowed down relative to the spread of formable material near the corners of the boundary edge. In an embodiment, the fluid is differentially slowed down by using gelling radiation distribution pattern.

Figure 4C:
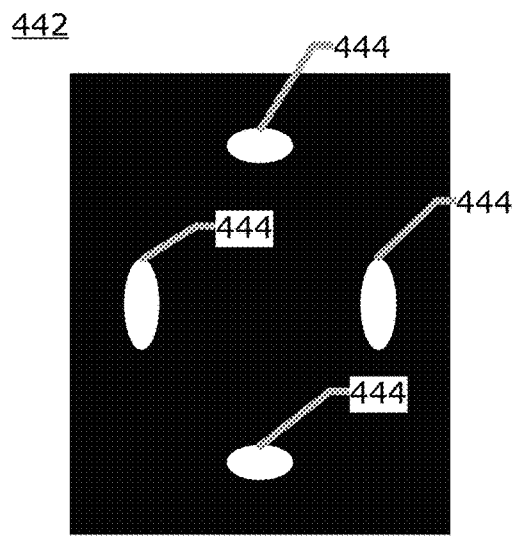
Figure 4D:
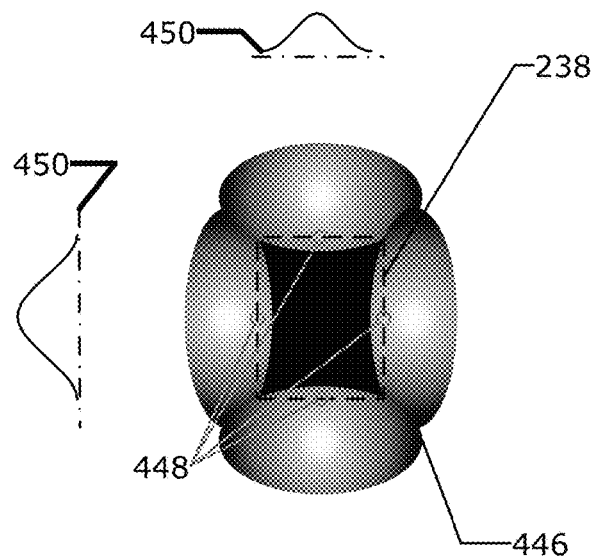

In an embodiment, the gelling radiation distribution pattern is created with a spatial filter 442 that includes a plurality of apertures 444. An example of a spatial filter 442 which may be used in an embodiment is illustrated in FIG. 4A and FIG. 4C. Examples of gelling radiation distribution pattern 446 are illustrated in FIG. 4B and FIG. 4D. The dashed line in FIG. 4B and FIG. 4D represents the boundary edge 238. Gelling radiation distribution pattern 446 includes a plurality of diffuse spots (4 spots in FIG. 4B and FIG. 4D). The center of each aperture 444 is offset from the boundary edge, the peak intensity produced by each of the apertures is outside of the imprinting field as shown in FIG. 4B and FIG. 4D. While the center of each aperture 444 is offset from the boundary edge, the center of each aperture is also aligned with the boundary edge centers 448 as illustrated in FIGS. 4A-H.

In an embodiment, apertures 444 may be circular (FIG. 4A) or elliptical (FIG. 4C), rectangular, square, or some other shape. In an embodiment, one or more of the apertures 444 may be adjustable in size. In an embodiment, a low intensity actinic radiation source is passed through the apertures 444 of a spatial filter 442. In an embodiment, the actinic radiation source used for curing the pattern region is also used for producing the gelling radiation distribution pattern 446 by passing the radiation from the source 126 through the spatial filter 442.

The total intensity of the radiation distribution pattern 446 may be reduced by passing the radiation through an intensity filter or by reducing the driving current of the source 126. In an embodiment, the actinic radiation source is an uncollimated actinic radiation source. In an embodiment, a low intensity pulsed light source is used to produce the gelling radiation distribution pattern 446 and a separate high intensity actinic radiation source is used to produce curing radiation distribution pattern. In an embodiment, the curing radiation distribution pattern has an intensity high enough to cure the formable material across the pattern region. In an embodiment, a gelling radiation source may be a convergent source or a divergent source. In an embodiment, a gelling radiation source may produce radiation distribution pattern 446 that has an intensity along the edges that is variable, such that the middle of the edges have higher intensity than the corners as illustrated by the intensity plots 450 along the boundary edges as illustrated in FIG. 4B and FIG. 4D. In an embodiment, a spatial filter is not used and instead a plurality of low intensity actinic radiation sources is used. Wherein each of the plurality of the low intensity actinic radiation sources produces a portion of the radiation distribution pattern 446 offset from the boundary edge.

As the gelling actinic radiation hits the formable material 124 through the apertures, the viscosity of the formable material 124 along the boundary edges 238 increases in a non-uniform manner. The viscosity in the boundary edge centers 448 increases faster than rate at which the viscosity increases at the boundary edge corners 240. This gelling radiation distribution pattern allows for the formable material to reach all parts of the boundary edge substantially simultaneously.

Figure 5A:
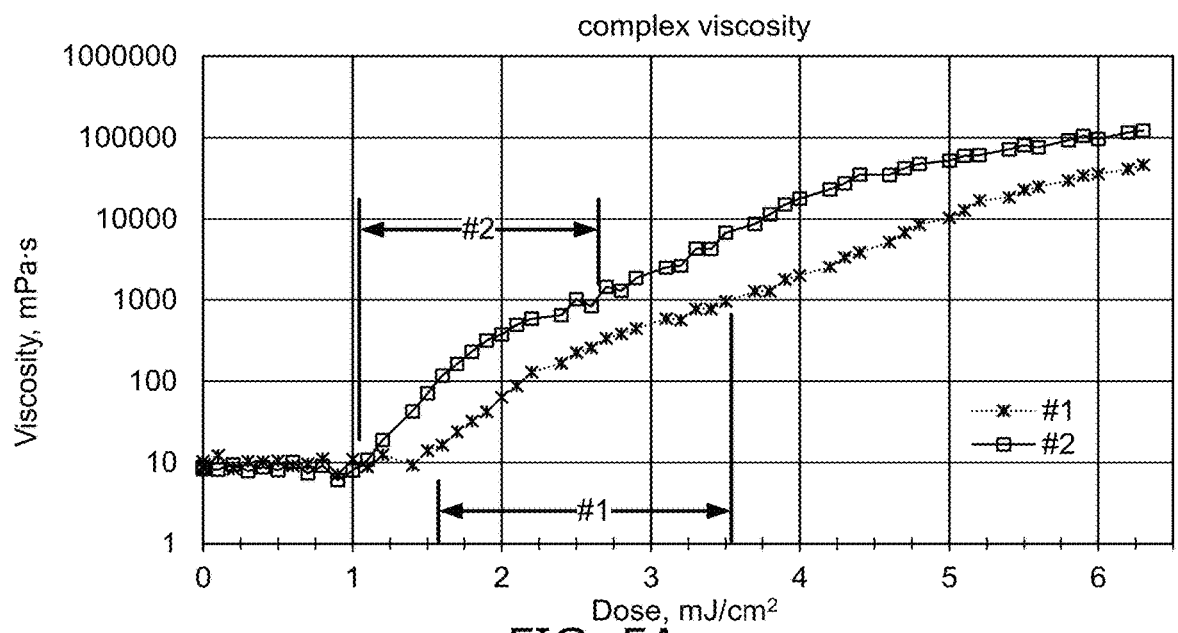
FIGS. 5A-5C are illustrations of viscosity, dose, intensity, and exposure times of formable material as used in embodiments.

FIG. 5A is a chart illustrating viscosity data for two formable material formulations (#1 and #2) as a function of actinic radiation exposure dose as disclosed in U.S. patent application Ser. No. 15/837,898 filed on Dec. 11, 2017 by the applicant of the present application and incorporated by reference herein. The applicant has determined that the appropriate actinic radiation dosage for these materials is indicated schematically by the corresponding ranges #1 and #2 as illustrated in FIG. 5A. The original formable material viscosity for both materials is around 10 mPa·s prior to being exposed to actinic radiation. The applicant has determined that the ranges for appropriate actinic radiation dosage is one where the formable material viscosity changes from 1.1× or 10× to 100× of the original formable material viscosity (11 or 100 to 1000 mPa·s). The actinic radiation source may have a light intensity of 50 to 500 mW/cm². In order to produce an exposure dosage of 1.0 or 1.5-3.5 mJ/cm² which requires an exposure time in the range of ~2 or 3 msec to 70 msec. This exposure time provides a gelling dosage of actinic radiation which gels the formable material outside of the pattern region during a spreading phase but at the same time may not completely cure it. The gelling dosage is approximately 1% to 4% of the total actinic radiation dose required to completely cure the fluid. The gelling dosage is a dosage that falls within a first dose range. The lower limit of the first dose range is a dosage that is greater than an initiation dosage at which polymerization starts to occur, for example at approximately 1 mj/cm². When the radiation is below the polymerization starting point other chemical reactions quench the polymerization reaction. The upper limit of the first dose range is a dose at which the fluid starts to turn into a solid, and interferes with alignment and the void elimination process. A second dose range is a curing dosage that is higher than first dose range and includes the total actinic radiation dose required to substantially solidify (cure) the fluid.

Table 1 below is an illustration of actinic radiation dose ranges and viscosity ranges that can be used in an exemplary embodiment for fluids #1 and #2. The gelling dosage is within the range in which a formable material becomes more viscous. The fluid can still move but the rate of spreading (velocity) significantly decreases.

TABLE 1

| Fluid | Thickening Dosage | Relative Viscosity increase | Viscosity range (mPa · s) |
|---|---|---|---|
| #1 | 1.4-3.5 mJ/cm² | 1.1×-100× | 11 to 1000 |
| #2 | 1-2.5 mJ/cm² | 1.1×-100× | 11 to 1000 |

The applicant has determined that the velocity at which the formable material spreads when it is sandwiched between a template 18 and a substrate 12 is approximately inversely proportional to the viscosity of the formable material. Thus increasing viscosity to a range of 1.1×, 1.5×, 2×, 5×, or 10× to 25×, 50× or 100× reduces a formable material flow rate (speed) and the flow rate down to 1% to 10% or 90% of the original values. For example, the viscosity may be increased, by approximately, 10%, 20%, 50%, 200%, 500%, 1000%, etc. The viscosity may increase such that extrusions are substantially eliminated. This can reduce the formation of extrusions as not only the formable material flows slower but the amount of formable material that flows out of the capillary slit (space between mesa 110 and substrate 102) is significantly reduced thus not allowing accumulation of any significant volume of formable material at the mesa edge.

Figure 5B:
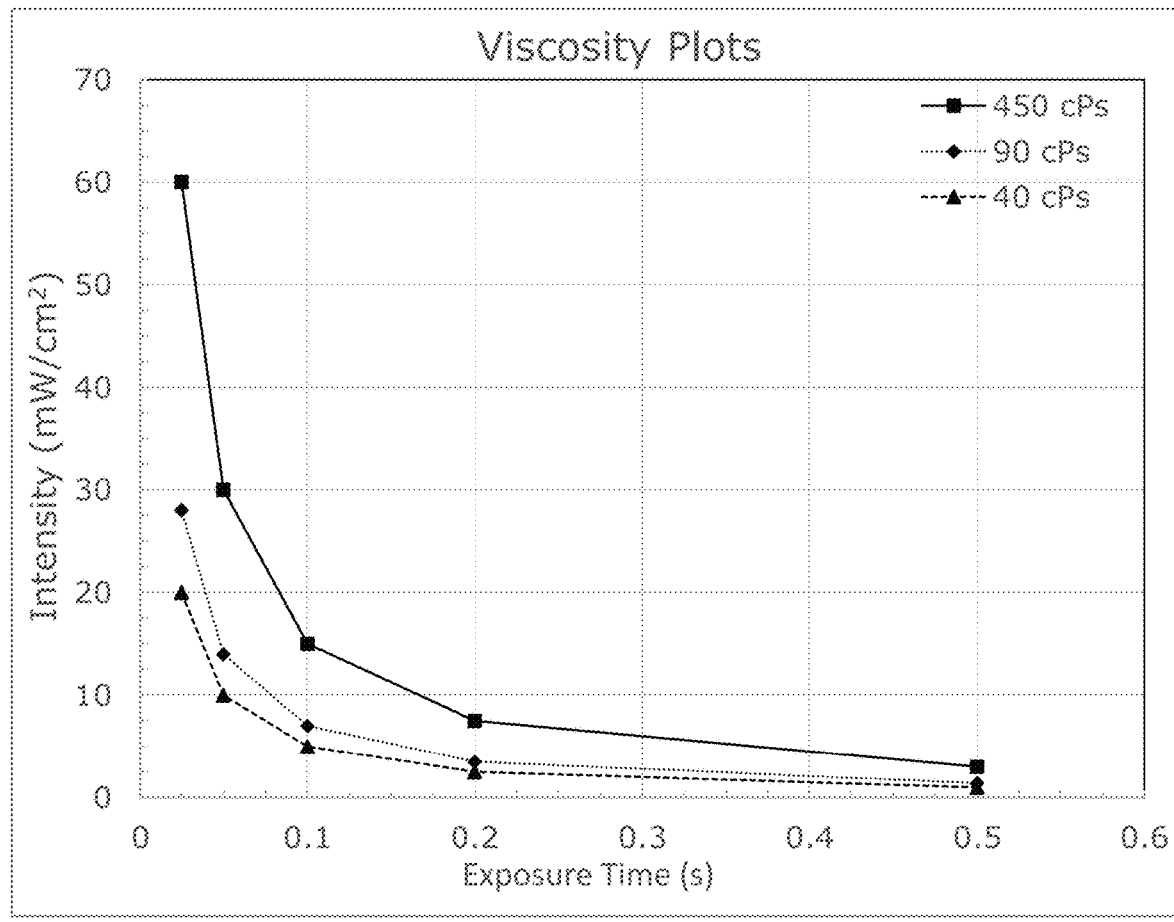
Figure 5C:
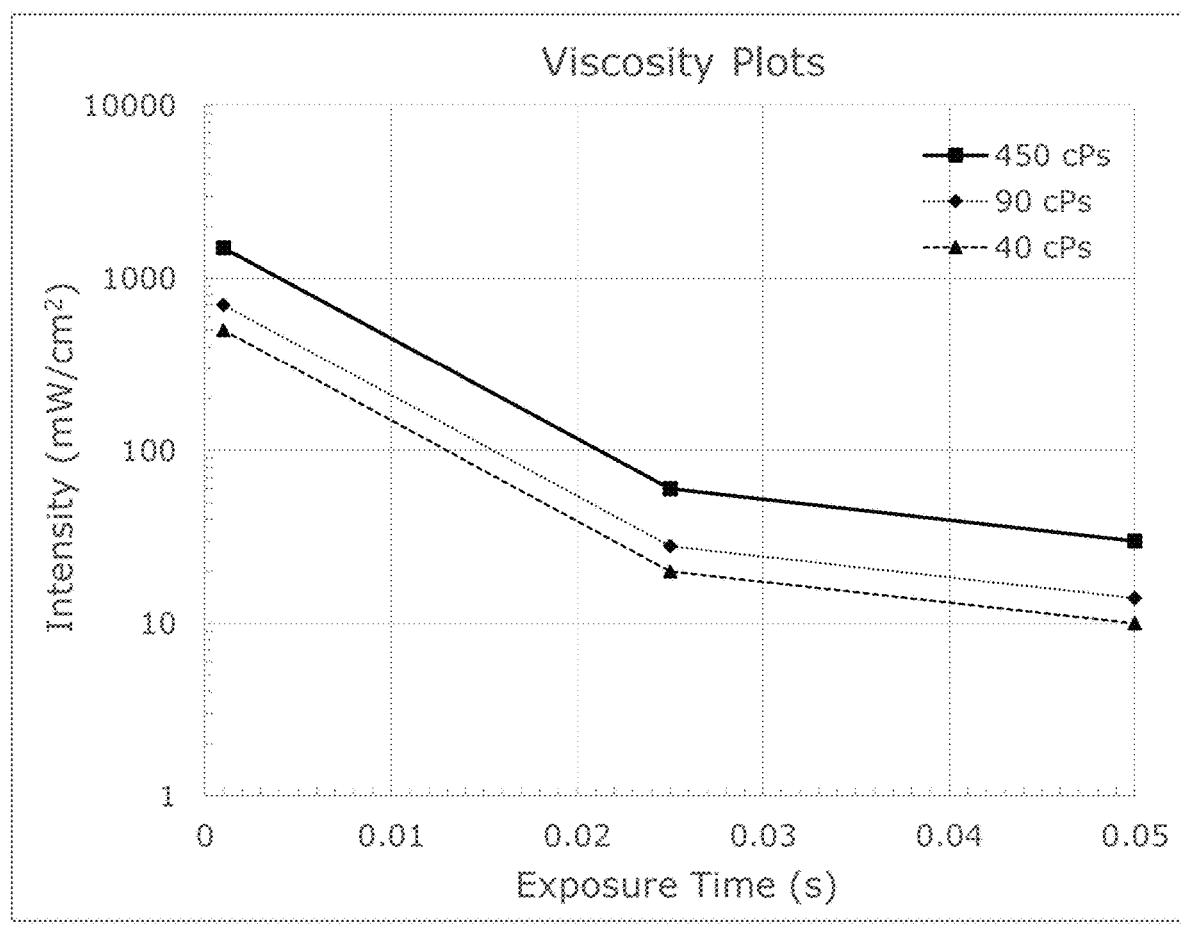

Prior to illumination with actinic radiation the viscosity of the formable material 124 may be around 10 centipoise (cPs). FIGS. 5B-C are charts of the required intensity and exposure time to achieve approximately a 4×, 10×, and 50× increase in viscosity that was estimated based on rheometer data for formable material 124 with initial viscosity of 10 centipoise. In an embodiment, the exposure time for gelling the formable material at the edge may be on the order of ~1-2 ms or up to 50 ms depending on the fill time and the throughput. In an embodiment, the gelling exposure time is 1, 2, 25, 50, 100, or 500 ms.

Figure 4E:
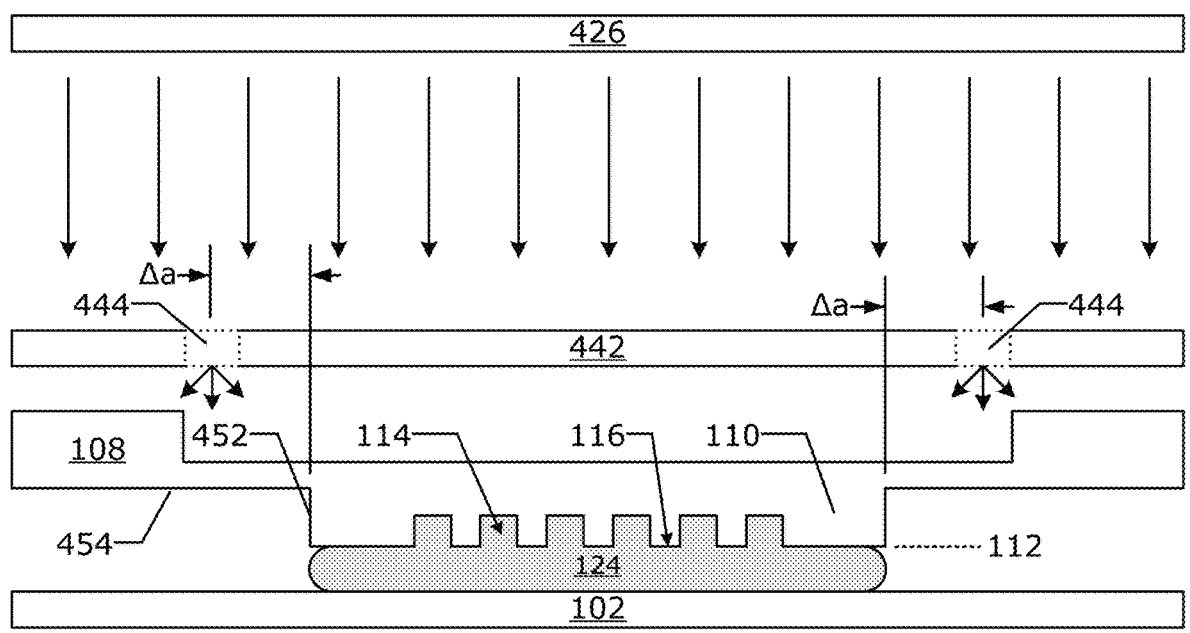
Figure 4F:
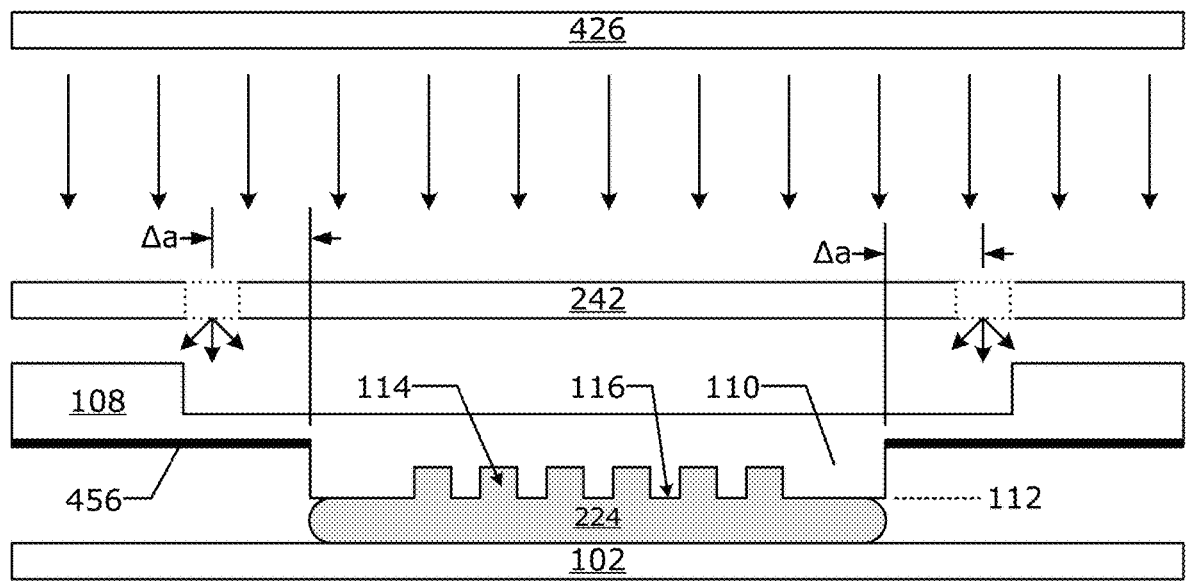
Figure 4G:
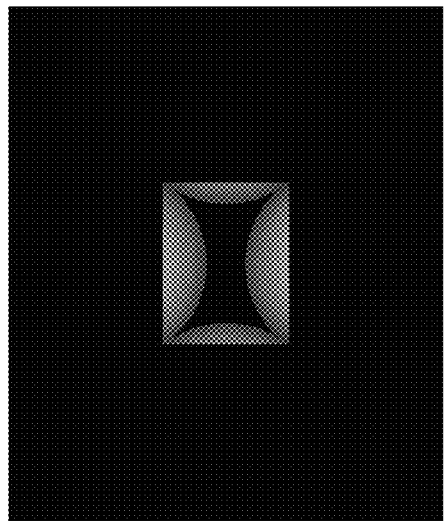
Figure 4H:
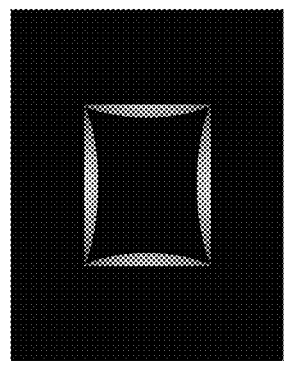
Figure 4I:
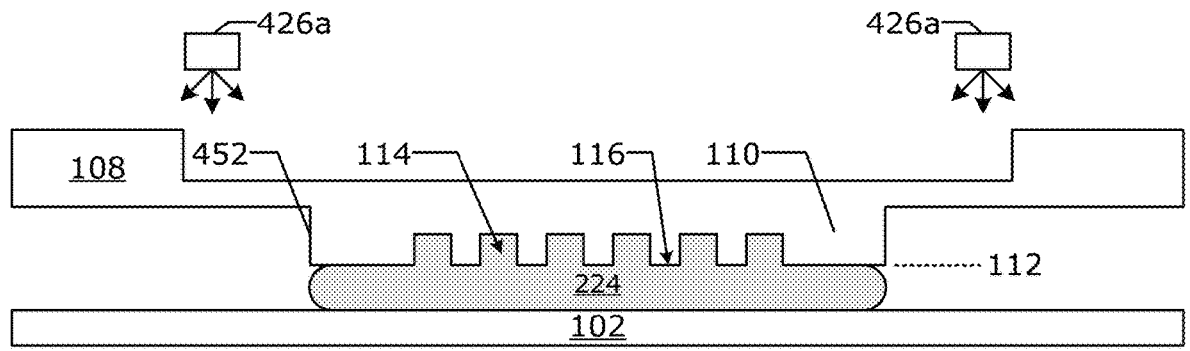

FIG. 4E is an illustration of spatial filter 442 positioned above the template 108. The spatial filter 442 may also be positioned farther away from the template 108 along an optical path which may be bent by one or more mirrors. As illustrated in FIG. 4E spatial filter 442 is positioned between a low energy actinic energy source 426 and the template 108 along an optical path. A center of the aperture 444 may be offset a distance Δa away from a mesa sidewall 452 as illustrated in FIG. 4E such that intensity distribution 450 is produced at the mesa sidewall 452. In an embodiment, an intersection of the mesa sidewalls 452 with the patterning surface 112 is coincident with the boundary edges 238. The mesa sidewalls 452 may connect a patterning surface 112 to a recessed surface 454 of the template 108 as illustrated in FIG. 4E. In an embodiment, the recessed surface 454 may be coated with a blocking coating 456. The blocking coating 456 may reflect, attenuate, or absorb the gelling radiation that is outside of boundary edges as illustrated in FIG. 4F which may produce a gelling radiation distribution pattern 446 as illustrated in FIGS. 4G-H. In an alternative embodiment, the blocking coating 456 is positioned on another portion of the template 108. An alternative embodiment, may include an additional spatial filter that blocks gelling radiation beyond the boundary edge. An alternative embodiment, may include multiple low intensity actinic radiation sources that 426a are divergent or convergent and positioned such that the sources in combination in combination they produce gelling radiation distribution pattern 446 as illustrated in FIG. 4I. FIGS. 4B, 4D, 4G, and 4H disclose gelling radiation distribution patterns 446 that have a minimum dose at the boundary corners 240, an alternative embodiment may have a minimum dose that is inset from the boundary corners 240.

Manufacturing Method

Figure 6:
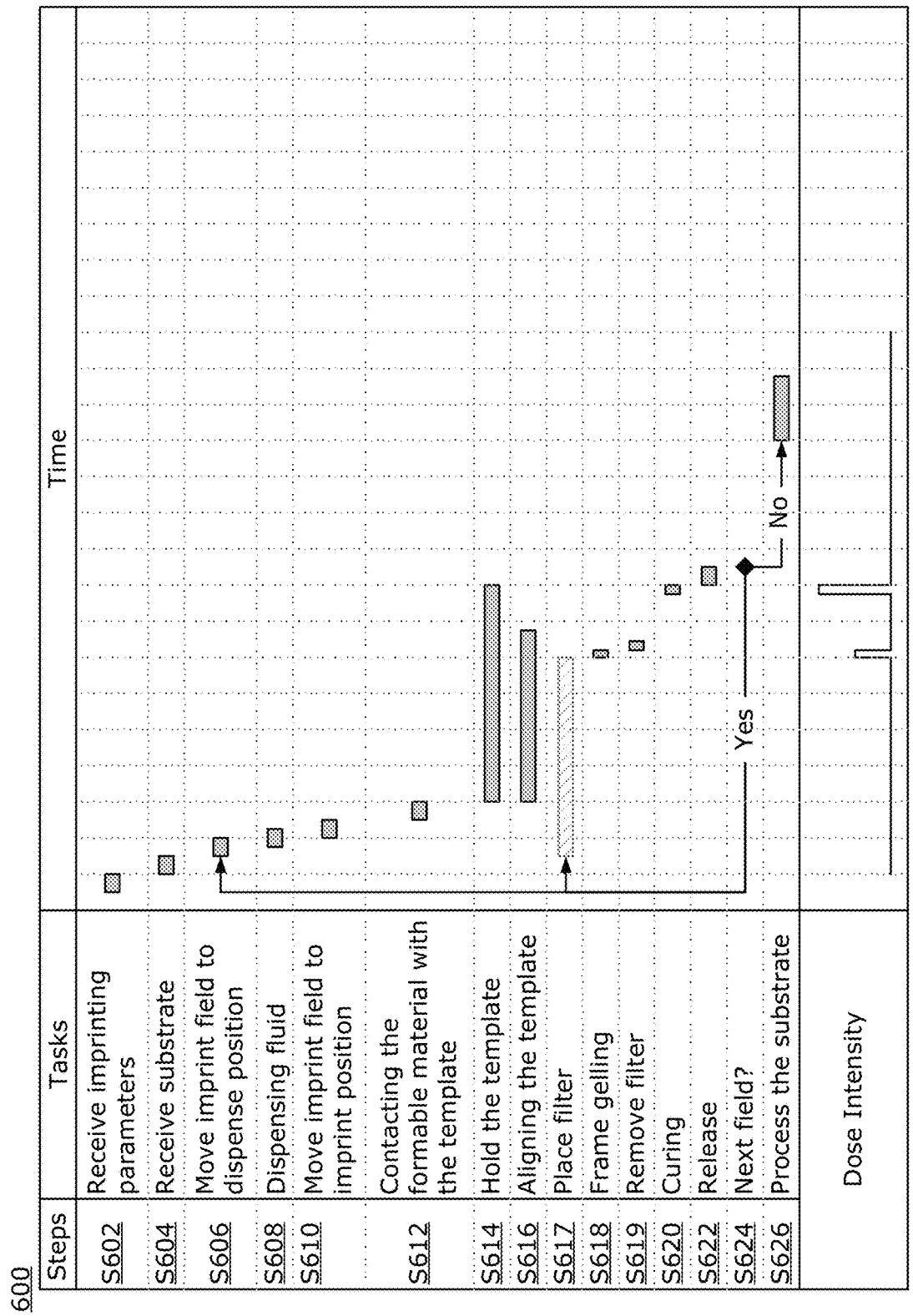
FIG. 6 is an illustration of a method as used in embodiments.

FIG. 6 is an illustration of a manufacturing method 600 which may use a nanoimprint lithography system 100. The manufacturing method 600 may include an information receiving step S602 in which the processor 132 receives imprinting parameters. The processor 132 may receive the imprinting parameters, store them in memory 134, and adjust the imprinting process such that it is tailored to the pattern being generated by the template 108. The imprinting process may also be tailored to the specifics of the substrate 102 on which the pattern is being applied.

The manufacturing method 600 may also include a substrate receiving step S604. The imprinting system 100 may include or be in communication with one or more substrate handling robots which implement step S604 by transferring one or more substrates 102 from substrate storage (e.g. a wafer carrier or a wafer cassette) to the substrate chuck 104. The substrate chuck 104 may hold the substrate 102 using one or more of a variety of techniques including but not limited to vacuum pressure, front facing clamps, pins, and tabs.

The manufacturing method 600 may also include a step S606 in which the positioning system moves the substrate chuck 104 and/or fluid dispenser 122 so that an imprint field on the substrate is positioned under the fluid dispensing system 122 which is performed after steps S602-4. The substrate 102 may be divided into a grid that includes a plurality of imprinting fields. In an alternative embodiment, the substrate is not divided into a plurality of imprint fields and the entire substrate is imprinted at one time. In an alternative embodiment, step S606 is skipped and the substrate is pre-coated with formable material 122. The manufacturing method 600 may also include a dispensing step S608 of dispensing formable material 124 onto the imprint field unless the substrate is pre-coated with formable material 124.

The manufacturing method 600 may also include moving the substrate 102 and/or the template 108 in a step S610 such that an imprint field is positioned under the patterning surface 122 of the template after steps S602-6.

The manufacturing method 600 includes a contacting step S612 in which the patterning surface 112 contacts the formable material 124 at an initial contact time $T_c$ after steps S602-8. In an embodiment, the moving step S610 may include moving the template chuck 118 down so that patterning surface 122 approaches the substrate surface 130 in an imprinting field with formable material 124 deposited upon it.

The manufacturing method 600 includes a template holding step S614 in which the template 108 is held in contact with the formable material 124 for a holding period until time $T_h$. The formable material 124 may spread due to capillary pressure and/or due to pressure applied by the template 108.

The manufacturing method 600 may include an alignment step S616 in which the patterning area of the template 108 is aligned with an imprint field on the substrate 102. The alignment step S616 may make use of alignment marks on the substrate 102 and the template 108. The alignment step S616 may include one or both of moving the template chuck 118 with the bridge and moving the substrate 102 with the substrate positioning stage 106. The alignment step S616 may be started before or after step S612 starts. The alignment step S616 may be performed continuously for a set period or until an alignment threshold is met. The alignment step S616 may be performed while other steps (i.e. steps S612, S614, and S618) are being performed. The alignment step S616 may be performed before and/or after initial contact time ($T_c$). The alignment step S616 may include both passive and active alignment.

The manufacturing method 600 includes a frame gelling step S618. Prior to the frame gelling step S618, a spatial filter 442 may be placed between an actinic radiation source and the template 108 in a step S617. The frame gelling step S618 may be performed by exposing the boundary edges 238 during the holding step S614. The frame gelling step S618 may include illuminating the formable material with a gelling radiation distribution pattern. The gelling radiation distribution pattern has a gelling dosage that is less than a curing dosage as illustrated in the dose intensity plot at the bottom of FIG. 6. The gelling radiation distribution pattern has a gradient dosage that gradually varies from a minimum gelling dosage at each of the plurality of corners of the boundary edges to a peak gelling dosage at a center of each of the boundary edges as illustrated in FIGS. 4B, 4D, and 4G-H. Each corner may have a unique minimum gelling dosage. The minimum gelling dosage may be zero or non-zero. In an alternative embodiment, the minimum gelling dosage is below a gelling dosage threshold required to gel the formable material. Each boundary edge center 448 may have a unique peak gelling dosage. In an embodiment, the peak gelling dosage below a curing dosage threshold required to cure the formable material and above the gelling dosage threshold required to gel the formable material. The gelling radiation distribution pattern may extend into the patterning region while gradually decreasing in intensity, from a peak at the boundary edge to zero inside the patterning region as illustrated in FIGS. 4B, 4D, 4G, and 4H.

The manufacturing method 600 may include a curing step S620 wherein the formable material 124 is cured at a solidifying time $T_s$. Prior to the curing step S620, the spatial filter 442 may be removed from between the actinic radiation source and the template 108 in a step S619. Methods of solidifying the formable material 124 includes but are not limited to one or more of applying heat, applying pressure, exposure to light, and exposure to chemicals. Solidifying, in the present context means that the solidified formable material substantially maintains it shape at least until the next processing step. In an embodiment, the formable material 124 is solidified by exposing the formable material 124 to actinic radiation from the energy source 126 along the path 128 through the template 108. The end of the curing step S620 may mark the end of the holding period $T_h$. The solidifying time $T_s$ may occur at a set period after the initial contact time $T_c$ by which time the template 108 has been aligned and any defect causing gas has been substantially purged out of the imprint field, such that defects are below a threshold.

The manufacturing method 600 includes a template release step S622 wherein the template 108 is separated from the solidified formable material. In an embodiment, one or more motors may be used to raise the template 108 away from the solidified formable material. After the release step S622, the process checks if there are additional fields in step S624, if yes then the process starts over again at step S606 and steps S606 through S624 are repeated.

If there are no additional fields then the substrate undergoes further processing in a step S626. The further processing in step S626 may include etching processes to transfer a relief image into the substrate that corresponds to the pattern in the patterned layer. The further processing in step S626 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprinting method configured to imprint formable material on a substrate with a template that has a pattern region that includes patterning features, the pattern region includes a boundary edge that surrounds the pattern region, the boundary edge includes a plurality of corners and a plurality of edges connecting each of the plurality of corners, the method comprising:
   bringing the template into contact with the formable material on the substrate;
   illuminating the formable material with a gelling radiation distribution pattern, wherein the gelling radiation distribution pattern has a gelling dosage that has a gradient dosage that varies from a minimum gelling dosage at each of the plurality of corners to a peak gelling dosage at a center of each of the boundary edges;
   wherein the gelling radiation distribution pattern comes from a plurality of apertures, wherein each aperture among the plurality of apertures is positioned equidistant from two corners among the plurality of corners of the template which is used to produce gelling radiation distribution pattern; and
   illuminating the pattern region with a curing radiation distribution pattern.

2. The imprinting method according to claim 1, wherein the gradient dosage gradually varies from the minimum gelling dosage at each of the plurality of corners of the boundary edge to the peak gelling dosage at the center of each of the boundary edges.

3. The imprinting method according to claim 1, wherein the gradient dosage varies in a step wise manner from the minimum gelling dosage at each of the plurality of corners of the boundary edge to the peak gelling dosage at the center of each of the boundary edges.

4. The imprinting method according to claim 1, wherein the method further comprises:
   placing a spatial filter in a first position in an optical path between an actinic energy source and the template so as to produce the gelling radiation distribution pattern; and
   placing the spatial filter in a second position not in the optical path between the actinic energy source and the template so as to illuminate the pattern region with the curing radiation distribution pattern.

5. The imprinting method according to claim 1, wherein:
   a first actinic energy source is used to illuminate the pattern region with the curing radiation distribution pattern; and
   a second actinic energy source is used to illuminate the pattern region with the curing radiation distribution pattern.

6. A method of manufacturing an article with an imprinting method, the imprinting method configured to imprint formable material on a substrate with a template that has a pattern region that includes patterning features, the pattern region includes a boundary edge that surrounds the pattern region, the boundary edge includes a plurality of corners and a plurality of edges connecting each of the plurality of corners, the method of manufacturing an article comprising:
   bringing the template into contact with the formable material on the substrate;
   illuminating the formable material with a gelling radiation distribution pattern, wherein the gelling radiation distribution pattern has a gelling dosage that has a gradient dosage that varies from a minimum gelling dosage at each of the plurality of corners to a peak gelling dosage at a center of each of the boundary edges;
   wherein the gelling radiation distribution pattern comes from a plurality of apertures, wherein each aperture among the plurality of apertures is positioned equidistant from two corners among the plurality of corners of the template which is used to produce gelling radiation distribution pattern; and
   illuminating the pattern region with a curing radiation distribution pattern; and
   processing the substrate on which the pattern has been formed, wherein the article is manufactured from the processed substrate.

\* \* \* \* \*